US012593628B2

(12) United States Patent
Hwang et al.

(10) Patent No.: US 12,593,628 B2
(45) Date of Patent: Mar. 31, 2026

(54) SILICON PRECURSOR HAVING A HETEROCYCLIC GROUP, COMPOSITION FOR DEPOSITING A SILICON-CONTAINING LAYER COMPRISING THE SAME AND METHOD OF DEPOSITING A SILICON-CONTAINING LAYER USING THE SAME

(71) Applicant: Samsung Electronics Co., Ltd., Suwon-si (KR)

(72) Inventors: Sunhye Hwang, Suwon-si (KR); Sung Gi Kim, Daejeon (KR); Jihyun Lee, Suwon-si (KR); Yujin Cho, Daejeon (KR); Seung Son, Daejeon (KR); Gyun Sang Lee, Daejeon (KR); Younjoung Cho, Suwon-si (KR); Byungkeun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 356 days.

(21) Appl. No.: 18/189,556

(22) Filed: Mar. 24, 2023

(65) Prior Publication Data

US 2023/0307227 A1 Sep. 28, 2023

(30) Foreign Application Priority Data

Mar. 25, 2022 (KR) ........................ 10-2022-0037167
Aug. 31, 2022 (KR) ........................ 10-2022-0109856
Oct. 17, 2022 (KR) ........................ 10-2022-0133285

(51) Int. Cl.
*H01L 21/02* (2006.01)
*C23C 16/40* (2006.01)
(Continued)

(52) U.S. Cl.
CPC ...... *H01L 21/02216* (2013.01); *C23C 16/401* (2013.01); *C23C 16/4408* (2013.01); *C23C 16/45553* (2013.01); *H01L 21/02164* (2013.01)

(58) Field of Classification Search
CPC ......... H01L 21/02216; H01L 21/02164; H01L 21/0228; C23C 16/401; C23C 16/4408; C23C 16/45553; C07F 7/1804
See application file for complete search history.

(56) References Cited

U.S. PATENT DOCUMENTS 7,084,080 B2 8/2006 Borovik et al.
7,417,160 B2 * 8/2008 Kornek ................ C07F 7/1892 556/424
(Continued)

FOREIGN PATENT DOCUMENTS

WO WO-2021/050368 A1 3/2021

OTHER PUBLICATIONS

Final Office Action issued Mar. 7, 2025 in U.S. Appl. No. 18/189,751.
(Continued)

*Primary Examiner* — Michael G Miller
(74) *Attorney, Agent, or Firm* — Fish & Richardson P.C.

(57) ABSTRACT

Provided are a silicon precursor having a heterocyclic group, a composition for depositing a silicon-containing layer including the same, and a method of depositing a silicon-containing layer using the same. The silicon precursor is represented by Formula 1.

[Formula 1]

(Continued)

In Formula 1, $A^1$ is a heterocyclic group including one or more nitrogen, and $R^1$ is hydrogen or an alkyl group of 1~6 carbon atoms. $R^2$ and $R^3$ may be each independently an alkyl group of 1~6 carbon atoms.

16 Claims, 4 Drawing Sheets

(51) Int. Cl.
*C23C 16/44* (2006.01)
*C23C 16/455* (2006.01)

(56) References Cited

U.S. PATENT DOCUMENTS

| | | | |
|---|---|---|---|
| 8,129,555 B2 | 3/2012 | Cheng et al. | |
| 9,200,167 B2 | 12/2015 | Spence et al. | |
| 9,875,888 B2 * | 1/2018 | Yan | C23C 16/45551 |
| 10,242,864 B2 | 3/2019 | Chandra et al. | |
| 2013/0196082 A1 | 8/2013 | Spence et al. | |
| 2021/0070783 A1 | 3/2021 | Odedra et al. | |
| 2021/0348026 A1 | 11/2021 | An et al. | |
| 2023/0307227 A1 | 9/2023 | Hwang et al. | |

OTHER PUBLICATIONS

Non-Final Office Action issued Sep. 25, 2024 in U.S. Appl. No. 18/189,751.

* cited by examiner

SILICON PRECURSOR HAVING A HETEROCYCLIC GROUP, COMPOSITION FOR DEPOSITING A SILICON-CONTAINING LAYER COMPRISING THE SAME AND METHOD OF DEPOSITING A SILICON-CONTAINING LAYER USING THE SAME

CROSS-REFERENCE TO RELATED APPLICATIONS

This U.S. non-provisional patent application claims priority under 35 U.S.C. § 119 of Korean Patent Application Nos. 10-2022-0037167, filed on Mar. 25, 2022, 10-2022-0109856, filed on Aug. 31, 2022, and 10-2022-0133285, filed on Oct. 17, 2022, the entire contents of which are hereby incorporated by reference.

BACKGROUND

The present disclosure herein relates to a silicon precursor having a heterocyclic group, a composition for depositing a silicon-containing layer including the same, and a method of depositing a silicon-containing layer using the same.

As semiconductor devices are highly integrated, circuits constituting the semiconductor device are miniaturized. Accordingly, the size of electronic devices, such as transistors or capacitors, is reduced, and the thickness of gate insulating layers and/or the dielectric layers of capacitors is reduced. Accordingly, leakage current properties may have a greater effect on electronic devices including said layers. As such, minimizing leakage current in such layers is required to match the industry demands. In order to achieve such requirements, various studies are conducted. In addition, when forming gate insulating layers or the dielectric layers of capacitors, it is also beneficial to achieve excellent step coverage properties and reduce cell distribution.

SUMMARY

The task for solving with regards to the present disclosure is to provide a method of depositing a silicon-containing layer, by which a silicon-containing layer with high quality may be formed.

Another task for solving with regard to the present disclosure is to provide a composition for depositing a silicon-containing layer, by which a silicon-containing layer with high quality may be formed.

Another task for solving with regards to the present disclosure is to provide a silicon precursor which may form a silicon-containing layer with high quality.

To achieve the task, embodiments of the inventive concepts provide a method of depositing a silicon-containing layer, including feeding a silicon precursor including a heterocyclic group and represented by Formula 1, or a composition for depositing a silicon-containing layer, including the silicon precursor to adsorb the silicon precursor on the substrate.

<Formula 1>

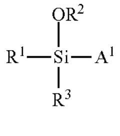

In Formula 1, $A^1$ is a heterocyclic group including one or more nitrogen, and $R^1$ is hydrogen or an alkyl group of 1~6 carbon atoms. $R^2$ is an alkyl group of 1~6 carbon atoms. $R^3$ is an alkyl group of 1~6 carbon atoms.

In Formula 1, $R^3$ may be an alkyl group of 1~4 carbon atoms.

In order to achieve another of the tasks, embodiments of the inventive concepts provide a composition for depositing a silicon-containing layer including the silicon precursor of Formula 1.

In order to achieve another of the tasks, embodiments of the inventive concepts provide a silicon precursor having the structure of Formula 1.

BRIEF DESCRIPTION OF THE FIGURES

The accompanying drawings are included to provide a further understanding of the inventive concepts, and are incorporated in and constitute a part of this specification. The drawings illustrate example embodiments of the inventive concepts and, together with the description, serve to explain principles of the inventive concept. In the drawings.

DETAILED DESCRIPTION

Figure 1A:
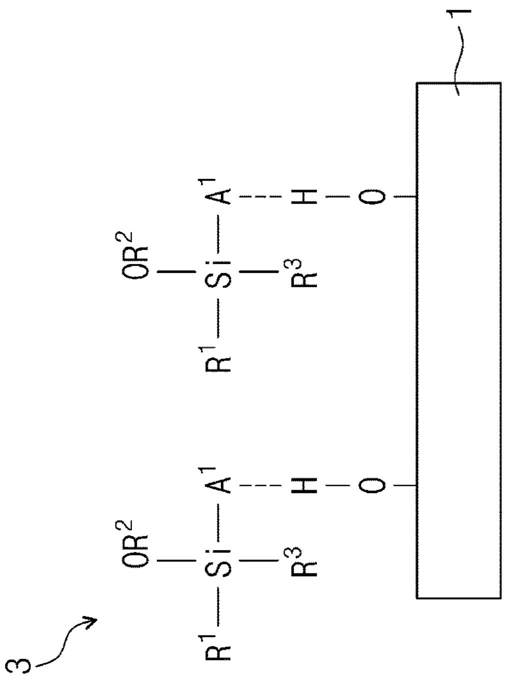
FIGS. 1A-1D are a process diagram showing a method of depositing a silicon-containing layer according to some example embodiments of the inventive concepts.

Some example embodiments of the inventive concepts will be explained in more detail with reference to the accompanying drawings. It will be understood that words or terms used in the specification and claims shall not be interpreted as the meaning defined in commonly used dictionaries, but that such words or terms should be interpreted as having a meaning that is consistent with their meaning in the context of the relevant art and the technical idea of the invention, based on the principle that an inventor may properly define the meaning of the words or terms to best explain the invention.

Accordingly, the configurations shown in embodiments in the specification are only some example embodiments of the inventive concepts and do not represent all of the technical scope of the inventive concepts. Therefore, it should be understood that various equivalents and modifications, which are replaceable with the embodiments are also possible.

The silicon precursor according to the inventive concepts has a structure of Formula 1 and includes a heterocyclic group ($A^1$). The composition for depositing a silicon-containing layer according to the inventive concepts includes a silicon precursor of Formula 1 (described below in further detail).

The heterocyclic group according to at least one embodiment of the inventive concept may include one or more nitrogen atoms and 2 to 12 carbon atoms. Further, the heterocyclic group may further include 1 to 4 heteroatoms, selected from oxygen, sulfur, or the like, in addition to the one or more nitrogen atoms. The heterocyclic group may include, for example, heteroaryl, heterocycloalkyl, heterocycloalkenyl, and/or the like, preferably, heterocycloalkyl. Preferably, the heterocyclic group may include 3-atom to 8-atom, preferably, a 3-atom to 6-atom heterocycloalkyl, containing one or more nitrogen, particularly, azetidinyl, morpholinyl, piperazinyl, and/or the like.

Alkyl according to an embodiment of the inventive concept is a saturated linear or branched hydrocarbon chain radical composed of only carbon and hydrogen.

FIGS. 1A-1D are a process diagram showing a method of depositing a silicon-containing layer according to at least some embodiments of the inventive concepts.

The method of depositing a silicon-containing layer includes performing a deposition process cycle shown in FIGS. 1A-(d) several times. The deposition method is preferably an atomic layer deposition (ALD). One deposition process cycle includes a step of feeding a silicon precursor 3, represented by Formula 1 and having the heterocyclic group, or a composition including the silicon precursor 3 into a process chamber in which a substrate 1 is loaded so as to adsorb the silicon precursor 3 on the substrate (first step, FIG. 1A).

<Formula 1>

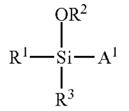

In Formula 1, $A^1$ is the heterocyclic group including one or more nitrogen; $R^1$ is hydrogen or an alkyl group of 1~6 carbon atoms; $R^2$ is an alkyl group of 1~6 carbon atoms; and $R^3$ is an alkyl group of 1~6 carbon atoms.

In at least some embodiments, the heterocyclic group may have a ring type formed by 2 to 8 carbon atoms. $R^1$ may be hydrogen or an alkyl group of 1~4 carbon atoms. $R^2$ may be an alkyl group of 1~4 carbon atoms. $R^3$ may be an alkyl group of 1~4 carbon atoms.

The silicon precursor 3 of Formula 1 may be referred to as a heterocyclic dialkoxy alkyl silane and/or a heterocyclic dialkoxy silane.

In the first step, a composition including the silicon precursor 3 may be fed.

In at least some embodiments, $A^1$ may be represented by Formula 2 or Formula 3.

<Formula 2>

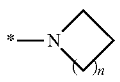

<Formula 3>

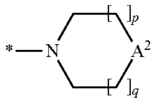

In Formula 2, n may be an integer of 0 to 5, and in Formula 3, p and q may be each independently an integer of 0 to 2. $A^2$ may be an oxygen atom (O) or $NR^4$, where $R^4$ may be an alkyl group of 1~6 carbon atoms.

In these examples, the silicon precursor 3 may have a structure of Formula 1-1 or 1-2.

<Formula 1-1>

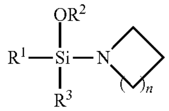

<Formula 1-2>

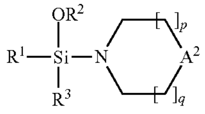

In Formula 1-1 or Formula 1-2, n may be an integer of 0 to 5, p and q may be each independently an integer of 0 to 2, and $A^2$ may be an oxygen atom (O) or $NR^4$, where $R^4$ may be an alkyl group of 1~6 carbon atoms.

In at least some embodiments, in Formula 1-1 and Formula 1-2, $A^2$ may be included in a heterocyclic group including one or more nitrogen and having 2 to 6 carbon atoms, $R^1$ may be hydrogen or an alkyl group of 1~4 carbon atoms, and $R^2$ and $R^3$ may be each independently an alkyl group of 1~4 carbon atoms.

In at least some embodiments, the silicon precursor 3 may have at least one structure among Formulae 2-1 to 2-7.

(2-1)

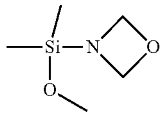

(2-2)

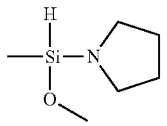

(2-3)

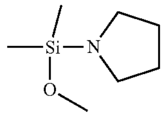

(2-4)

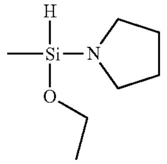

(2-5)

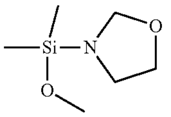

(2-6)

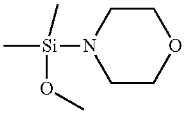

(2-7)

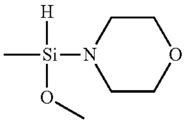

Referring to FIG. 1A, in Formula 1, the heterocyclic group of $A^1$ has high affinity with "H" of the OH group of the surface of the substrate 1, and through this affinity, the silicon precursor 3 is adsorbed on the surface of the substrate 1 well. Accordingly, the heterocyclic group of $A^1$ may function as an adsorption functional group for an atomic layer deposition (ALD) process.

The silicon precursor 3 including one heterocyclic group of $A^1$ does not deteriorate vaporization and at the same time, shows excellent thermal stability and reactivity, and thus is suitable for an ALD process.

In Formula 1, the alkyl group of $R^1$ is hydrogen or an alkyl group of 1~6 carbon atoms, particularly, hydrogen or an alkyl group of 1~4 carbon atoms, more particularly, hydrogen or a methyl group or an ethyl group (having 1 or 2 carbon atoms). Accordingly, the alkyl group of $R^1$ has a relatively small molecular weight. Accordingly, the molecular weight of the silicon precursor may be reduced to increase vaporization. The alkyl group of $R^1$ may act as a functional group improving vaporization.

Also, $R^3$ is an alkyl group of 1~6 carbon atoms, particularly, an alkyl group of 1~4 carbon atoms, more particularly, a methyl group or an ethyl group (e.g., having 1 to 2 carbon atoms), and it is thought that $R^3$ plays the same role as $R^1$.

In Formula 1, the alkoxy group of —$OR^2$ has high bonding force with Si. Accordingly, if the silicon precursor includes the alkoxy group of —$OR^2$, the decomposition of the silicon precursor is not easy, and the silicon precursor may be applied to a high temperature (for example, about 550° C.-700° C.) suitable for an ALD process (e.g., corresponding to an ALD window section).

More specifically, the silicon precursor of the inventive concepts does not include a halogen atom such as chlorine. If the silicon precursor includes a halogen atom, the halogen atom has high bonding force with the silicon, and during the depositing of a silicon-containing layer, the probability of the presence of the halogen atom in the silicon-containing layer increases. In these cases, the halogen atom may act as a trap site for charges, and thus if the silicon-containing layer includes the halogen atom like this, problems that may related to the trap site of charge and/or the increased leakage current may occur. However, the silicon precursor of the inventive concepts does not include a halogen atom, and therefore such problems may be reduced and/or prevented.

Figure 1B:
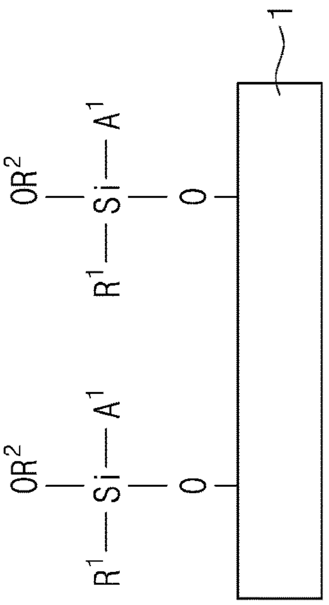
Figure 1C:
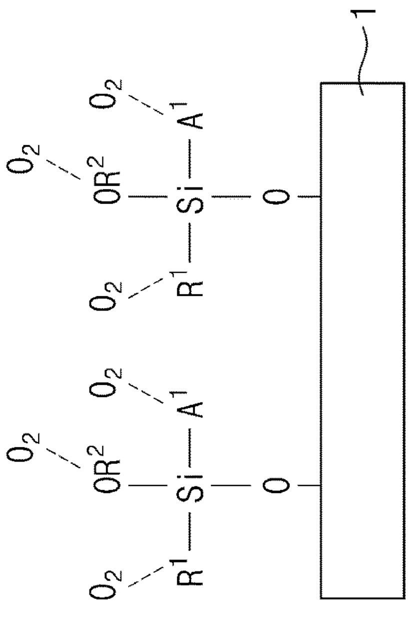

During the feeding of the silicon precursor 3 to adsorb the silicon precursor 3 on the substrate (first step, FIG. 1A), the temperature of the substrate 1 may preferably be maintained at about 550° C.-700° C., more preferably, about 550° C.-650° C. At this temperature, $R^1$ or $R^3$ of the silicon precursor 3 and the hydrogen ("H") of the surface of the substrate 1 may be separated, and a portion of the silicon precursor 3 may be bonded to the oxygen ("O") at the surface of the substrate 1 as illustrated in FIG. 1B.

One deposition process cycle may further include purging the silicon precursor 3 not adsorbed on the substrate 1 (second step), feeding a reaction gas into the process chamber for the reaction with the adsorbed/bonded silicon precursor 3 on the substrate 1 (third step, FIG. 1*c*), and purging unreacted reaction gas with the silicon precursor 3.

The reaction gas may be an oxidizer, and may include, for example, at least one of oxygen ($O_2$), ozone ($O_3$), oxygen plasma, hydrogen, hydrogen plasma, ammonia, and/or nitrogen plasma. The resulting silicon-containing layer may be a silicon oxide layer, a silicon nitride layer, or a silicon oxynitride layer. Oxygen ($O_2$) is fed as the reaction gas in the illustration of FIG. 1A, as an illustrative example, but, as noted above, the example embodiments are not limited thereto. The reaction gas may be fed in a flow rate of about 1000-4000 sccm.

The reaction gas may react with carbon atoms included in the $R^1$, the $OR^2$ and the $A^1$ of the silicon precursor 3 to produce gases having small molecular weights (such as $CO_2$, CO, and $CH_4$). Accordingly, as illustrated in FIG. 1D, the $R^1$, $OR^2$, $R^3$ and $A^1$ of the silicon precursor 3 may be removed to form a silicon oxide layer 5 having a thickness of one atomic layer.

Figure 1D:
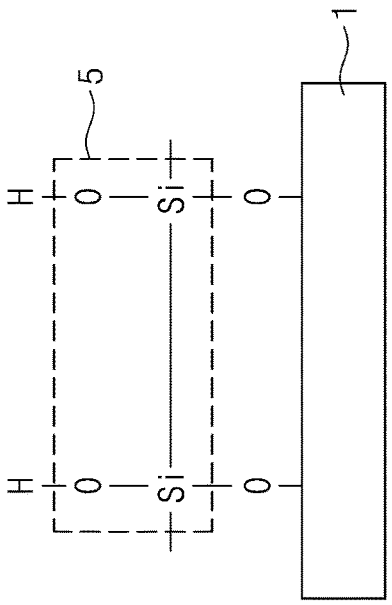

By repeating the deposition process cycle several times, the silicon oxide layer 5 in FIG. 1D may be stacked upward to a desired thickness.

In at least one embodiment, the silicon precursor 3 may be provided in a vapor state. For example, the silicon precursor 3 may be heated to a temperature wherein the silicon precursor 3 does not degrade, for example, to about 30-120° C., but the example embodiments are not limited thereto. In at least some embodiments, when feeding the silicon precursor 3 of the first step, a carrier gas may also be supplied. For example, the carrier gas may be an inert gas such as a nitrogen ($N_2$) gas. The carrier gas may be fed in a flow rate of, for example, about 50-200 sccm (standard cubic centimeters per minute. In at least some examples, the first step may be performed for about 5-20 seconds per deposition. The third step may be performed for about 10-20 seconds per oxidation.

The purging process of the second step and the fourth step may be performed by feeding, for example, an inert gas such as nitrogen gas. In this case, the nitrogen gas may be fed in a flow rate of about 1000-3000 sccm. The second step may be performed for a longer time than the fourth step. For example, the second step may be performed for about 20-40 seconds and the fourth step may be performed for about 1-10 seconds. Accordingly, the process defects due to unreacted silicon precursor may be prevented.

The method for depositing a silicon-containing layer according to the inventive concepts uses the silicon precursor represented by Formula 1, and a dense silicon-containing layer (for example, a silicon oxide layer) may be formed without halogen atoms. Accordingly, an electronic device including the silicon-containing layer formed according to the inventive concepts may prevent/reduce leakage current. The silicon-containing layer may be used as a gate insulating layer, the dielectric layer of a capacitor, the tunnel insulating layer of a nonvolatile memory device, and/or the like.

Hereinafter, particular embodiments (experimental embodiments) according to the inventive concepts will be explained.

Example 1

Synthesis of Pyrrolidinodimethylmethoxysilane

Under an anhydrous and inert atmosphere, pyrrolidine ($HN(CH_2)_2(CH_2)_2$, 200 g, 2.81 mol) and hexane ($C_6H_{14}$, 1,211 g, 14.06 mol) were injected to a flame-dried 5000 mL flask. Then, 2.60 M n-butyllithium ($C_4H_9Li$, 1,082 mL, 2.81 mol), was slowly injected while maintaining the temperature at about −20° C. The resultant was stirred at room temperature for about 5 hours to prepare a pyrrolidine lithium salt. To a mixture solution of hexane ($C_6H_{14}$, 500 mL) and dimethoxydimethylsilane ($(CH_3O)_2Si(CH_2)_2$, 338 g, 2.81 mol), the thus prepared pyrrolidine lithium salt ($C_4H_8LiN$) was slowly added while maintaining the temperature at about −20° C.

After finishing the addition, the temperature of the reaction solution was slowly raised to room temperature, and stirring was performed at room temperature for about 6 hours. After finishing the reaction, the reaction mixture was filtered to remove lithium methoxide ($LiOCH_3$), and the solvent of the filtrate was removed under a reduced pressure and distilled at a temperature of about 36° C. and a pressure of about 5 torr to obtain pyrrolidinodimethylmethoxysilane ($(CH_3O)Si(CH_3)_2N(CH_2)_2(CH_2)_2$, 232 g, 1.46 mol) of Formula 2-3 (yield 72.3%).

The composition of the pyrrolidinodimethylmethoxysilane was confirmed using nuclear magnetic resonance ($^1H$-NMR ($C_6D_6$): δ 3.31(s, 3H ($CH_3O$)Si), 2.95(m, 4H, (($CH_2)_2(CH_2)_2$NSi), 1.54(m, 4H (($CH_2)_2(CH_2)_2$NSi), and 0.11(s, 6H Si($CH_3)_2$)).

Figure 2:
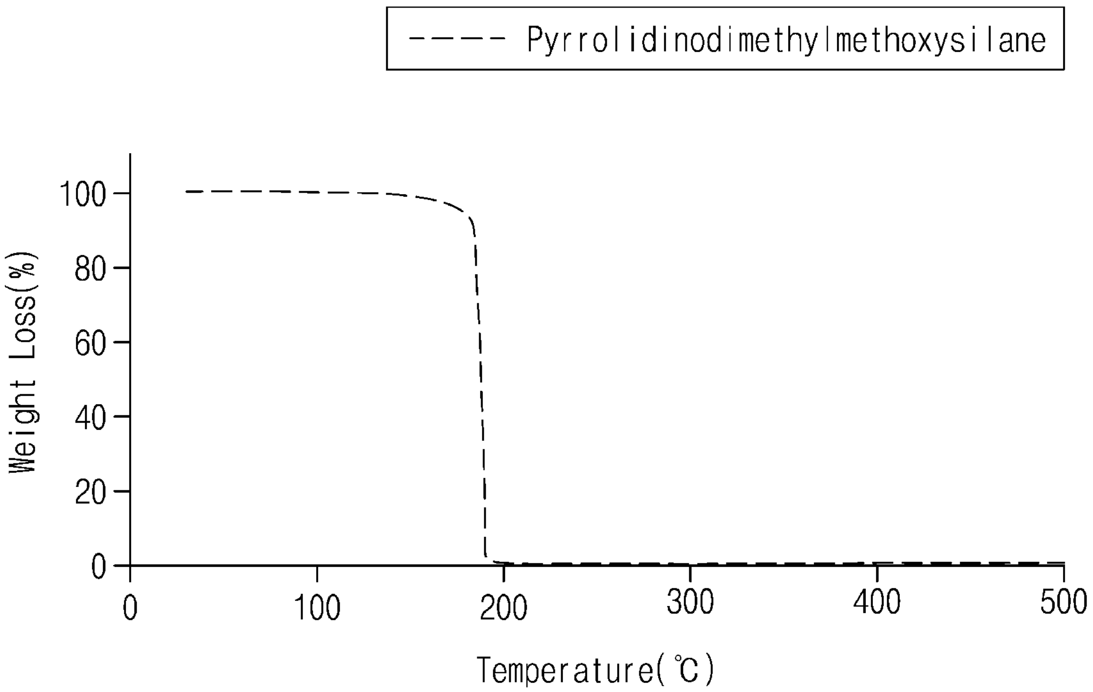
FIG. 2 is a thermogravimetric (TG) graph of a silicon precursor.

FIG. 2 is a thermogravimetric (TG) graph of the silicon precursor prepared in Example 1.

Referring to FIG. 2, it could be found that the mass of pyrrolidinodimethylmethoxysilane, which is the silicon precursor prepared in Example 1, was stably maintained at almost 100%, while the temperature was maintained at under about 200° C., but was less than about 1% at a temperature higher about 200° C., and a residual mass was rarely confirmed. From this, it could be found that pyrrolidinodimethylmethoxysilane was vaporized at a temperature around 200° C. Accordingly, it could be found that intermolecular decomposition/reaction did not occur in the pyrrolidinodimethylmethoxysilane, and material storage stability was excellent.

Figure 3:
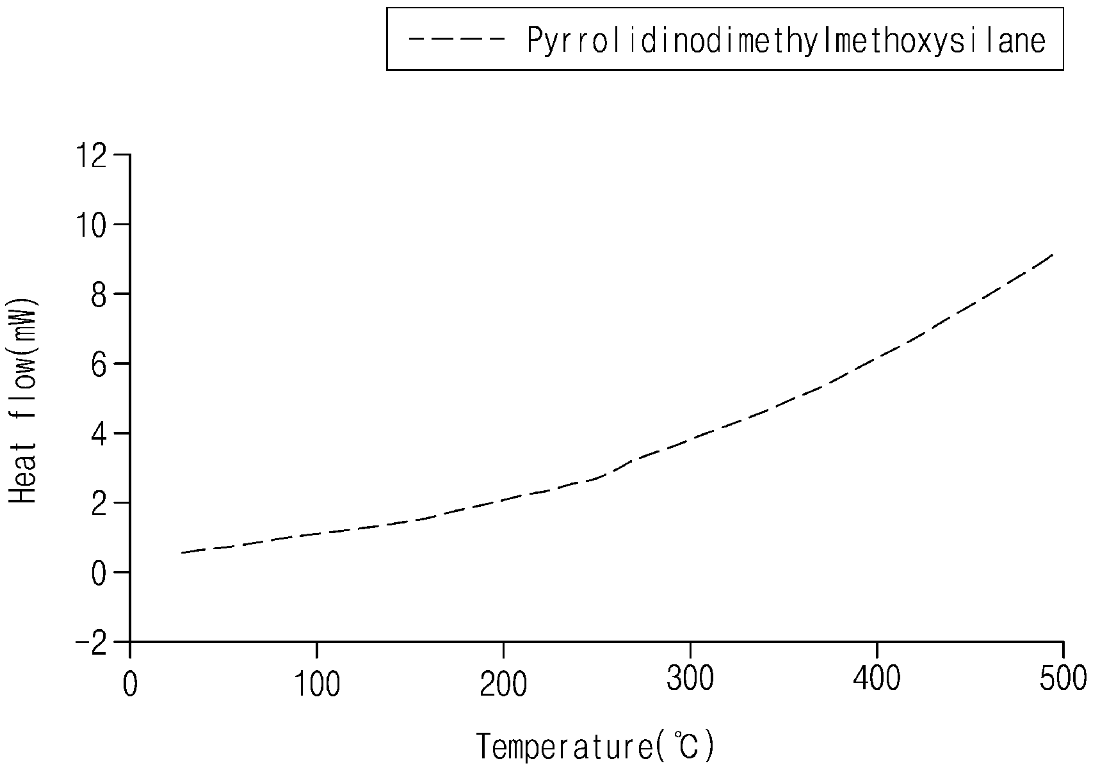
FIG. 3 is a differential scanning calorimetry (DSC) graph of a silicon precursor.

FIG. 3 is a differential scanning calorimetry (DSC) graph of a silicon precursor prepared in Example 1.

Referring to FIG. 3, the pyrrolidinodimethylmethoxysilane which is the silicon precursor prepared in Examples 1, showed not much change in heat. Accordingly, it could be found that the thermal decomposition did not arise for the pyrrolidinodimethylmethoxysilane at a temperature of less than about 500° C. at an atmospheric pressure, and that the pyrrolidinodimethylmethoxysilane is thermally stable at a temperature of less than about 500° C. at an atmospheric pressure. Since an ALD process is performed at a low pressure, the pyrrolidinodimethylmethoxysilane may be stable at a temperature of about 550-700° C. Therefore, it could be found that the pyrrolidinodimethylmethoxysilane is suitable for an ALD process.

Figure 4:
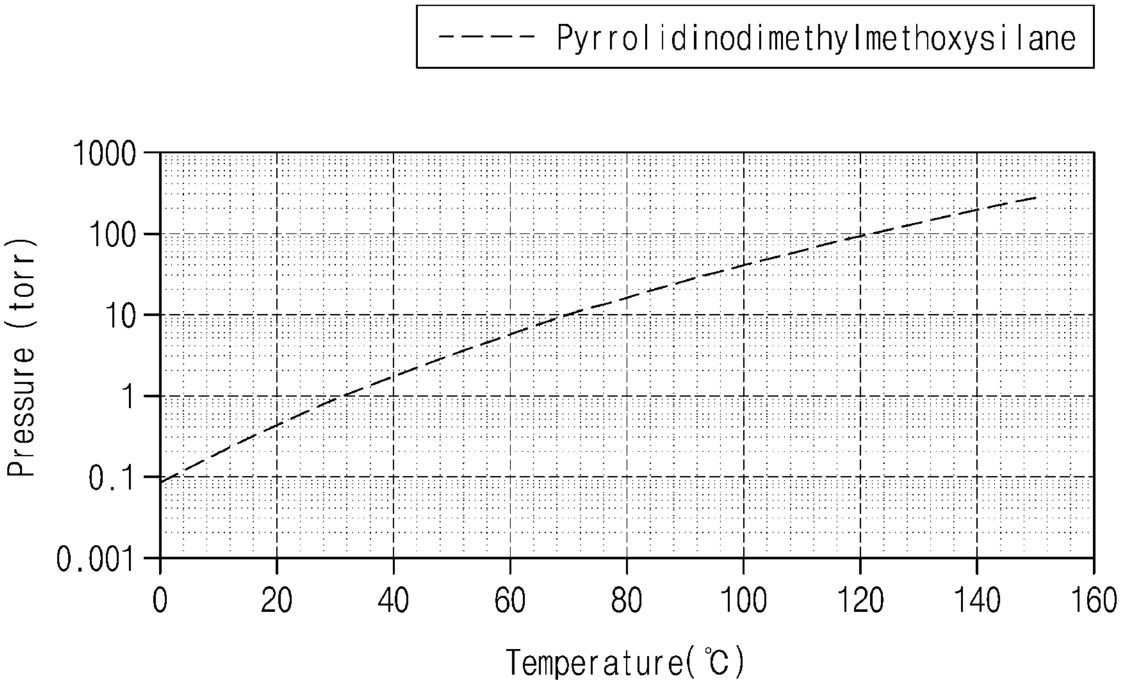
FIG. 4 is a vaporization pressure graph of a silicon precursor.

FIG. 4 is a vaporization pressure graph of a silicon precursor prepared in Example 1.

Referring to FIG. 4, it could be found that the vapor pressure of the pyrrolidinodimethylmethoxysilane, which is the silicon precursor prepared in Example 1, increased in accordance with the temperature. By using this, the pyrrolidinodimethylmethoxysilane could be vaporized and fed in an ALD process. Therefore, it could be found that the pyrrolidinodimethylmethoxysilane is suitable for an ALD process.

From FIG. 2 to FIG. 4, it could be found that the pyrrolidinodimethylmethoxysilane has excellent thermal stability and a vapor pressure suitable for ALD.

Example 2

Deposition of Silicon Oxide Layer by Atomic Layer Deposition (ALD) using the pyrrolidinodimethylmethoxysilane of Example 1.

On silicon substrates (corresponding to reference numeral 1 in (a) of FIG. 1), which are bare wafers, an ALD deposition process was performed to deposit silicon oxide layers. In this case, the compound of Example 1, pyrrolidinodimethylmethoxysilane was used as the silicon precursor 3, and a 200-300 mm Batch Type ALD equipment of a vertical furnace type was used. According to the change of the conditions of the ALD deposition process, for example, the temperature of the silicon substrate, the feeding time of the silicon precursor (will be referred to as a source below) and the feeding time of a reaction gas (will be referred to as a reactant below), the growth rate, the composition and the etching rate of the deposited silicon oxide layer were observed. The temperature of the silicon substrate was changed in a range of about 550-700° C. (corresponding to the "evaluation of ALD window"). The feeding time of the silicon precursor was changed in about 5-20 seconds (corresponding to the "evaluation on source feeding time split"). The feeding time of the reaction gas was changed in about 5-20 seconds (corresponding to the "evaluation on reactant feeding time").

The ALD deposition process was performed by repeating the process cycle several times. One process cycle included the processes below.

A stainless steel bubbler container was charged with the silicon precursor of the pyrrolidinodimethylmethoxysilane, and was maintained at about 30° C.

The silicon substrate was set to about 550-700° C. First, the pyrrolidinodimethylmethoxysilane in the stainless steel bubbler container was vaporized and fed/transported to the silicon substrate 1 in a process chamber with about 100 sccm of a nitrogen gas as a carrier gas and adsorbed on the silicon substrate. Second, about 2,000 sccm of a nitrogen gas was fed for about 30 seconds as a purge gas to purge/remove the silicon precursor not adsorbed. Third, oxygen and hydrogen were fed as reactants. In this case, oxygen was fed in a flow rate of about 3,500 sccm, and hydrogen was fed in a flow rate of about 1,200 sccm. Fourth, a nitrogen gas was fed in a flow rate of about 2,000 sccm for about 5 seconds as a purge gas to purge/remove by-products and remaining reactants.

Hereinafter, the particular conditions of the deposition process of the silicon oxide layer are shown in Table 1.

TABLE 1

| Source Silicon oxide layer deposition conditions | | Pyrrolidinodimethylmethoxysilane ALD Window | | |
|---|---|---|---|---|
| Substrate temperature (° C.) | | 550, 600, 650, 700 | 600 | 600 |
| Silicon precursor | Heating temperature (° C.) | 30 | 30 | 30 |
| | Feeding time (sec) | 10 | 5, 10, 20 | 10 |
| Purge gas | Flow rate (sccm) | 2000 | 2000 | 2000 |
| | Time (sec) | 30 | 30 | 30 |
| Reactant | Oxygen flow rate (sccm) | 3500 | 3500 | 3500 |
| | Hydrogen flow rate (sccm) | 1200 | 1200 | 1200 |
| | Time (sec) | 10-20 | 10 | 10, 20 |
| Purge gas | Flow rate (sccm) | 2000 | 2000 | |
| | Time (sec) | 5 | 5 | 5 |
| Deposition process cycle number | | | 140 | |

The thickness of the silicon oxide layer deposited under the conditions of Table 1 was measured through ellipsometer, and the growth rate and refractivity of the deposited silicon oxide layer are shown in Table 2.

TABLE 2

| Evaluation | Substrate temperature (° C.) | Silicon precursor feeding time (sec) | Reactant feeding time (sec) | Process cycle number | Layer thickness [Å] | Growth rate [Å/cycle] | Refractivity |
|---|---|---|---|---|---|---|---|
| ALD | 550 | 10 | 10 | 140 | 134 | 0.96 | 1.48 |
| window | 600 | 10 | 10 | 140 | 143 | 1.02 | |
| | 650 | 10 | 10 | 140 | 145 | 1.04 | |
| | 700 | 10 | 10 | 140 | 174 | 1.24 | |
| Source | 600 | 5 | 10 | 140 | 132 | 0.95 | |
| feeding | | 10 | 10 | 140 | 143 | 1.02 | |
| time split | | 20 | 10 | 140 | 151 | 1.08 | |
| Reactant | 600 | 10 | 10 | 140 | 143 | 1.02 | |
| feeding | | 10 | 20 | 140 | 149 | 1.06 | |
| time split | | | | | | | |

According to Table 2, the refractivity of the deposited silicon oxide layer was maintained to about 1.48. It is considered because the thickness of the deposited silicon oxide layer is thin to a degree of about 200 Å.

The composition and ratio of the silicon oxide layer deposited under ALD window (about 550-700° C.) conditions were analyzed using an X-ray photoelectron spectroscopy (XPS) and a Secondary Ion Mass Spectrometry (SIMS), and the results are shown in Table 3.

TABLE 3

| Substrate temperature (° C.) | Composition of layer (at %) | | | | $O_x$/Si ratio |
|---|---|---|---|---|---|
| | C | N | O | Si | |
| 550 | 0.0 | 0.0 | 65.7 | 34.3 | 1.92 |
| 600 | 0.0 | 0.0 | 65.9 | 34.1 | 1.93 |
| 650 | 0.0 | 0.0 | 65.6 | 34.4 | 1.91 |
| 700 | 0.0 | 0.0 | 65.8 | 34.2 | 1.92 |

Referring to Table 3, it was confirmed that no carbon and nitrogen were found in the silicon oxide layer formed in Example 2. This may mean that charge trap due to carbon or nitrogen atoms in the silicon oxide layer was also not produced. Therefore, leakage current through the silicon oxide layer could be prevented/reduced. In addition, the ratio of oxygen/silicon in the silicon oxide layer was maintained to an almost equal level even though the temperature of the silicon substrate increased. In addition, the wet etching rate of the silicon oxide layer deposited in a range of about 550-700° C. was analyzed. Wet etching was performed twice for about 10 seconds each using hydrofluoric acid ($H_2O$:HF=200:1) as an etchant, and the thickness was measured by the number of etchings. The results are shown in Table 4.

TABLE 4

| Substrate temperature (° C.) | Wet etching rate (Å/sec) | |
|---|---|---|
| | $1^{st}$ Etching | $2^{nd}$ Etching |
| 550 | 4.3 | 3.2 |
| 600 | 3.8 | 2.7 |
| 650 | 3.0 | 2.0 |
| 700 | 2.6 | 1.4 |

According to Table 4, it could be found that the etching rate is about 1.4 to about 3.2 Å/sec, and very excellent wet etching resistance was confirmed. In addition, according to the increase of the temperature of the substrate from about 550° C. to about 700° C., the etching rate of the deposited silicon oxide layer was reduced. Accordingly, it could be found that the etching resistance of the deposited silicon oxide became excellent with the increase of the temperature of the substrate during the deposition.

In the method of depositing a silicon-containing layer, the material of Formula 1 is used as a silicon precursor, and leakage current may be prevented/reduced, and a dense silicon-containing layer of high quality may be formed.

The silicon precursor according to some example embodiments has a heterocyclic group and does not deteriorate vaporization, and at the same time, has excellent thermal stability and reactivity, and thus is particularly suitable for an ALD process, thereby forming a silicon-containing layer of high quality.

Also, the composition for depositing a silicon-containing layer according to some example embodiments of the inventive concepts is formed by the silicon precursor, and the silicon-containing layer may be of high quality.

Although the embodiments of the present invention have been described, it is understood that the present invention should not be limited to the embodiments, but various changes and modifications can be made by one ordinary skilled in the art within the spirit and scope of the present invention as hereinafter claimed.

What is claimed is:

1. A silicon precursor represented by Formula 1:

<Formula 1>

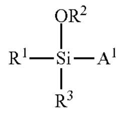

wherein the $A^1$ is a heterocyclic group and comprises one or more nitrogen, the $R^1$ is hydrogen or an alkyl group of 1-6 carbon atoms, and the $R^2$ and the $R^3$ are each independently an alkyl group of 1-6 carbon atoms.

2. The silicon precursor of claim 1, wherein the heterocyclic group comprises 2 to 8 carbon atoms, the $R^1$ is hydrogen or an alkyl group of 1-4 carbon atoms, and the $R^2$ and the $R^3$ are each independently an alkyl group of 1-4 carbon atoms.

3. The silicon precursor of claim 1, wherein the $A^1$ is represented by at least one of Formula 2 or Formula 3:

<Formula 2>

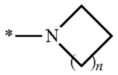

<Formula 3>

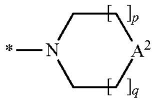

in Formula 2, the n is an integer of 0 to 5, in Formula 3, the p and the q are each independently an integer of 0 to 2, and the $A^2$ is an oxygen atom (O) or $NR^4$, where the $R^4$ is an alkyl group of 1-6 carbon atoms.

4. The silicon precursor of claim 1, wherein the silicon precursor is represented by at least one of Formula 1-1 or Formula 1-2:

<Formula 1-1>

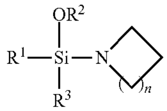

<Formula 1-2>

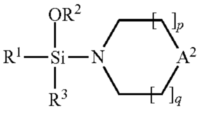

the n is an integer of 0 to 5, the p and the q are each independently an integer of 0 to 2, the $A^2$ is an oxygen atom (O) or $NR^4$, and the $R^4$ is an alkyl group of 1-6 carbon atoms.

5. The silicon precursor of claim 1, wherein the silicon precursor has at least one structure among the following Formulae 2-1 to 2-7:

(2-1)

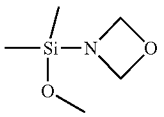

(2-2)

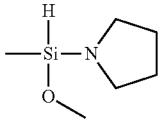

(2-3)

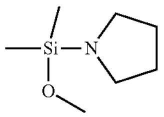

(2-4)

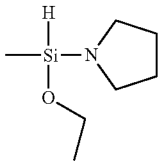

-continued (2-5)

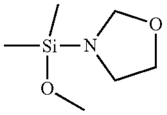

(2-6)

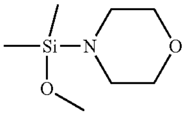

(2-7)

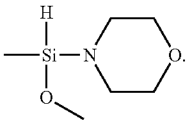

6. A composition for depositing a silicon-containing layer, the composition comprising the silicon precursor of claim 1.

7. A method of depositing a silicon-containing layer, the method comprising:

feeding a silicon precursor into a process chamber in which a substrate is loaded such that the silicon precursor is adsorbed onto the substrate, the silicon precursor represented by Formula 1, <Formula 1>

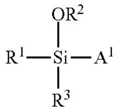

wherein the $A^1$ is a heterocyclic group and comprises one or more nitrogen, the $R^1$ is hydrogen or an alkyl group of 1-6 carbon atoms, and the $R^2$ and the $R^3$ are each independently an alkyl group of 1-6 carbon atoms.

8. The method of claim 7, wherein the heterocyclic group comprises 2 to 8 carbon atoms, the $R^1$ is hydrogen or an alkyl group of 1-4 carbon atoms, and the $R^2$ and the $R^3$ are each independently an alkyl group of 1-4 carbon atoms.

9. The method of claim 7, wherein the $A^1$ is represented by at least one of Formula 2 or Formula 3:

<Formula 2>

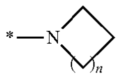

<Formula 3>

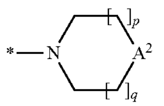

in Formula 2, the n is an integer of 0 to 5, in Formula 3, the p and the q are each independently an integer of 0 to 2, and the $A^2$ is an oxygen atom (O) or $NR^4$, where the $R^4$ is an alkyl group of 1-6 carbon atoms.

10. The method of claim 7, wherein the silicon precursor is represented at least one of Formula 1-1 or Formula 1-2:

<Formula 1-1>

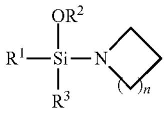

<Formula 1-2>

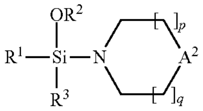

the n is an integer of 0 to 5, the p and the q are each independently an integer of 0 to 2, the $A^2$ is an oxygen atom (O) or $NR^4$, and the $R^4$ is an alkyl group of 1-6 carbon atoms.

11. The method of claim 7, wherein the silicon precursor has at least one structure among the following Formulae 2-1 to 2-7:

(2-1)

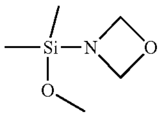

(2-2)

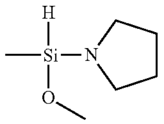

(2-3)

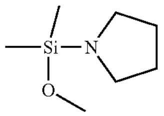

-continued (2-4)

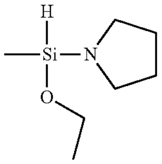

(2-5)

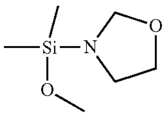

(2-6)

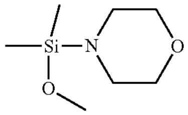

(2-7)

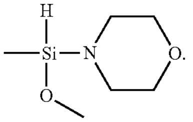

12. The method of claim 7, wherein a temperature of the substrate is maintained at 550° C.-700° C. during the feeding of the silicon precursor.

13. The method of claim 7, further comprising:

purging the process chamber to remove the silicon precursor which is not adsorbed on the substrate;

feeding a reaction gas into the purged process chamber to react with the silicon precursor adsorbed on the substrate; and purging the reaction gas which is unreacted with the silicon precursor.

14. The method of claim 13, wherein the reaction gas is at least one of oxygen, ozone, oxygen plasma, hydrogen, or hydrogen plasma.

15. The method of claim 13, wherein the purging of the silicon precursor not adsorbed and the purging of the reaction gas unreacted includes feeding nitrogen gas into the process chamber.

16. The method of claim 7, wherein the silicon-containing layer is a silicon oxide layer.

* * * * *